United States Patent [19]
Tran et al.

[11] Patent Number: 5,546,433
[45] Date of Patent: Aug. 13, 1996

[54] DIGITAL PHASE LOCK LOOP HAVING FREQUENCY OFFSET CANCELLATION CIRCUITRY

[75] Inventors: Toan V. Tran, San Jose; Richard Henderson, Sunnyvale, both of Calif.

[73] Assignee: National Semiconductor Corporation, Del.

[21] Appl. No.: 408,027

[22] Filed: Mar. 21, 1995

[51] Int. Cl.$^6$ ............................................. H03D 3/24
[52] U.S. Cl. ................. 375/376; 331/10; 331/17; 331/1 A; 364/162
[58] Field of Search ............................ 327/150, 159, 327/147; 375/376; 331/1 A, 1 R, 4, 16, 17, 25, 10; 364/162

[56] References Cited

U.S. PATENT DOCUMENTS

| | | | |
|---|---|---|---|
| 4,143,361 | 3/1979 | Tammes et al. | 340/347 |
| 4,750,058 | 6/1988 | Hirt et al. | 360/46 |
| 4,929,918 | 5/1990 | Chung et al. | 331/10 |
| 5,097,489 | 3/1992 | Tucci | 375/120 |
| 5,111,203 | 5/1992 | Calkins | 341/141 |
| 5,168,246 | 12/1992 | Pulluru et al. | 331/10 |
| 5,319,450 | 6/1994 | Tamayama et al. | 348/692 |

OTHER PUBLICATIONS

William D. Llewellyn, et al., High–Speed Data Recovery (WAM 1.1: A 33Mb/s Data Synchronizing Phase–Locked Loop Circuit, presented on Feb. 17, 1988 at the IEEE International Solid–States Circuit Conference.

National Semiconductor DP8459 Data Sheet, Mass Storage Handbook, 1989, pp. 2–29 through 2–63.

Beomsup Kim, High–Speed Clock Recovery in VLSI Using Hybrid Analog/Digital Techniques, Memo #UCB/ERL M90/50, Jun. 6, 1990, Elect. Research Lab., UC Berkeley (particularly p. 81).

Frank Goodenough, DSP Technique Nearly Doubles Disk Capacity, Electronic Design, Feb. 4, 1993, pp. 53–56 and 58.

J. D. Coker, R. L. Galbraith, G. J. Kerwin, J. W. Rae, P. A. Ziperovich, Implementation of PRML in a Rigid Disk Drive, IBM Storage Systems Products Division, Rochester, MN 55901, San Jose, CA 95193.

Timothy J. Schmerbeck et al., A 27 MHz Mixed Analog/Digital Magnetic Recording Channel DSP Using Partial Response Signalling with Maximum Likelihood Detection, IEEE Internat'l Solid State Circuits Conference 1991.

*Primary Examiner*—Stephen Chin
*Assistant Examiner*—Thuy-Lieu Nguyen
*Attorney, Agent, or Firm*—Limbach & Limbach L.L.P.

[57] ABSTRACT

A phase-lock loop (PLL) circuit can be locked on to a synthesizer frequency without decreasing the available range of the frequency differences which the PLL circuit can accommodate during a data receive mode. An analog-to-digital conveyer (ADC) receives an analog input signal and responds to a periodic clock signal by providing a corresponding digital output signal. A phase comparator is coupled to receive the ADC digital output signal and to provide a phase error signal which is representative of a phase error in the digital output signal. A filter accumulates the value of the phase error signal into a filter first register to generate a primary frequency error value. The filter further includes a filter second register for holding a secondary frequency error value (e.g., a value which corrects for an offset between a synthesizer frequency and the PLL free-running frequency). A primary digital-to-analog converter (DAC) converts a primary filter output value, which includes the primary frequency error value, to a corresponding primary analog output signal. A secondary DAC converts a secondary filter output value, which includes the secondary frequency error value from the filter second register, to a corresponding secondary analog output signal responsive to the secondary filter output value. The primary analog output signal and the secondary analog output signal the combined to provide a control signal to an oscillator that provides the clock signal to the ADC. The frequency of the clock signal is controlled by the control signal.

4 Claims, 3 Drawing Sheets

DIGITAL PHASE LOCK LOOP HAVING FREQUENCY OFFSET CANCELLATION CIRCUITRY

FIELD OF THE INVENTION

The present invention relates to phase-lock loop (PLL) circuits and, in particular, to a PLL which has circuitry for performing frequency offset cancellation circuitry without decreasing the operating range of the PLL.

BACKGROUND

A timing block in a communication system (e.g., a system for reading data from, and writing data to, a hard disk drive), typically employs a signal from a frequency synthesizer in transmitting data (e.g., in a disk drive system, for writing data to the disk). A phase lock loop (PLL) is typically used in receiving data (e.g., in a disk drive system, for reading data from the disk) to "lock on" to the received data. Thus, it is important that the synthesizer frequency and the PLL free-running frequency be equal.

FIG. 1 is a block diagram illustrating a conventional digital PLL 10. In a "data receive" mode of operation, PLL 10 receives an analog input data signal, DATA, via a multiplexor 12. An analog-to-digital converter (ADC) 14 uses a clock signal CLK to sample the analog input data signal and to generate digital data signal samples. The digital samples generated by ADC 14 may be received by a receiver (not shown).

A phase comparator 16 receives the digital data signal samples generated by ADC 14 and generates phase error signal samples, $\phi_e$, which are representative of the phase error between a received digital data signal sample and a previously-received digital data signal.

A well-known proportional-integral-derivative (PID) filter 18 is coupled to filter the phase error signal samples, $\phi_e$. PID filter 18 is shown in more detail in FIG. 2. The integral path 26 of PID filter 18, utilizing an adder element 28, accumulates successively received phase error signal samples $\phi_2$ into an integral register 30. (The accumulated value, representing a frequency error in the analog input data signal DATA, is designated in FIG. 2 as $D_I$.) The accumulated value $D_I$ is provided as a first input to an adder 32. The value from the derivative path 34 of the PID filter 18, which represents an instantaneous rate of change of phase error in the analog input data signal DATA, is provided as a second input to adder 32; and the value from the proportional path 36 of the PID filter 18, which represents the phase error in the analog input data signal DATA, is provided as a third input to adder 32. The values $c_d$, $c_p$, and $c_i$ are "multiplier coefficients" for adjusting the gain of the derivative path 34, the proportional path 36, and the integral path 26, respectively. Adder 32 adds together the values provided to its three inputs and provides the result, as a digital frequency error value, to a digital-to-analog converter (DAC) 20.

Referring back to FIG. 1, DAC 20 converts the digital frequency error value to an analog oscillator control signal and provides the analog oscillator control signal to a voltage-controlled oscillator (VCO) 22. The output of VCO 22 is the clock signal CLK which ADC 14 uses to sample the analog data signal DATA. (Clock signal CLK is also provided as a time base for use by other elements of PLL 10. For example, as shown in FIG. 1, clock signal CLK is also provided to phase comparator 16 and to PID filter 18.)

As discussed above, a frequency synthesizer 24 is typically used by a communication channel in transmitting data. Since, as discussed above, it is important that the synthesizer frequency and the PLL free-running frequency (used for receiving data) be equal, a "reference lock" mode is typically employed to lock PLL 10 to the synthesizer 24 frequency before PLL 10 is used for receiving data.

In particular, referring still to FIG. 1 in the reference lock mode, multiplexor 12 is controlled by a REF_LOCK signal to provide a synthesizer 24 output signal SYNTH_CLK (or, alternatively, a signal which has a frequency that is some predetermined fraction of the frequency of SYNTH_CLK) to the ADC 14 in place of the incoming analog input data signal DATA. Once PLL 10 locks onto the frequency of SYNTH_CLK, the accumulated frequency error value $D_I$ in integral register 30 is copied into an initial offset register 38. (The copied value is designated in FIG. 2 as $C_{I-f}$.) Then, when commencing a "data receive" mode, $C_{I-f}$ is copied into the integral register 30 as an initial value of $D_I$.

A disadvantage of the conventional PLL architecture illustrated in FIGS. 1 and 2 is that some of the range of the DAC 20 must be used in "data receive" mode to correct for the difference between the synthesizer 24 frequency and the PLL 10 free-running frequency. In particular, if the difference between the synthesizer 24 frequency and the PLL 10 free-running frequency is large the DAC 20 may not have enough additional range to allow PLL 10 to lock onto the analog input data signal DATA. While the range of the DAC 20 could be increased, doing so would require increasing the accuracy of the DAC 20.

SUMMARY OF THE INVENTION

The present invention provides a phase lock loop (PLL) circuit which can be locked on to a synthesizer frequency without increasing the range of the PLL DAC that is available for locking the PLL onto the incoming data signal.

In particular, the present invention provides a PLL which comprises an analog-to-digital converter (ADC) that receives an analog input signal and responds to a periodic clock signal by providing a corresponding digital output signal. A phase comparator is coupled to receive the ADC digital output signal and to provide a phase error signal which is representative of a phase error in the output signal. A filter accumulates the value of the phase error signal into a filter first register to generate a primary frequency error value. The filter further includes a filter second register for holding a secondary frequency error value (e.g., a value which corrects for an offset between a synthesizer frequency and the PLL free-running frequency). A primary digital-to-analog converter (DAC) converts a primary filter output value, which includes the primary frequency error value, to a corresponding primary analog output signal. A secondary DAC converts a secondary filter output value, which includes the secondary frequency error value from the filter second register, to a corresponding secondary analog output signal responsive to the secondary filter output value. The primary analog output signal and the secondary analog output signal are combined to provide a control signal to an oscillator that provides the clock signal to the ADC. The frequency of the clock signal is controlled by the control signal.

A better understanding of the features and advantages of the present invention will be obtained by reference to the following detailed description and accompanying drawings which set forth an illustrative embodiment in which the principles of the invention are utilized.

DETAILED DESCRIPTION

Figure 2:
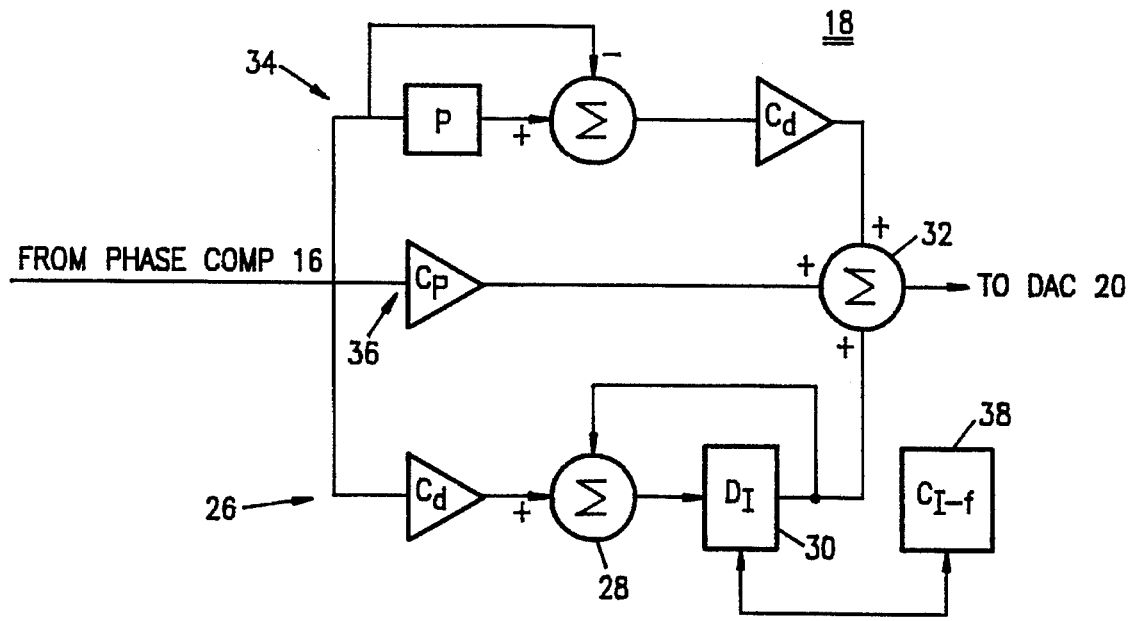
FIG. 2 is a block diagram of the PID filter of the PLL circuit of FIG. 1.
Figure 3:
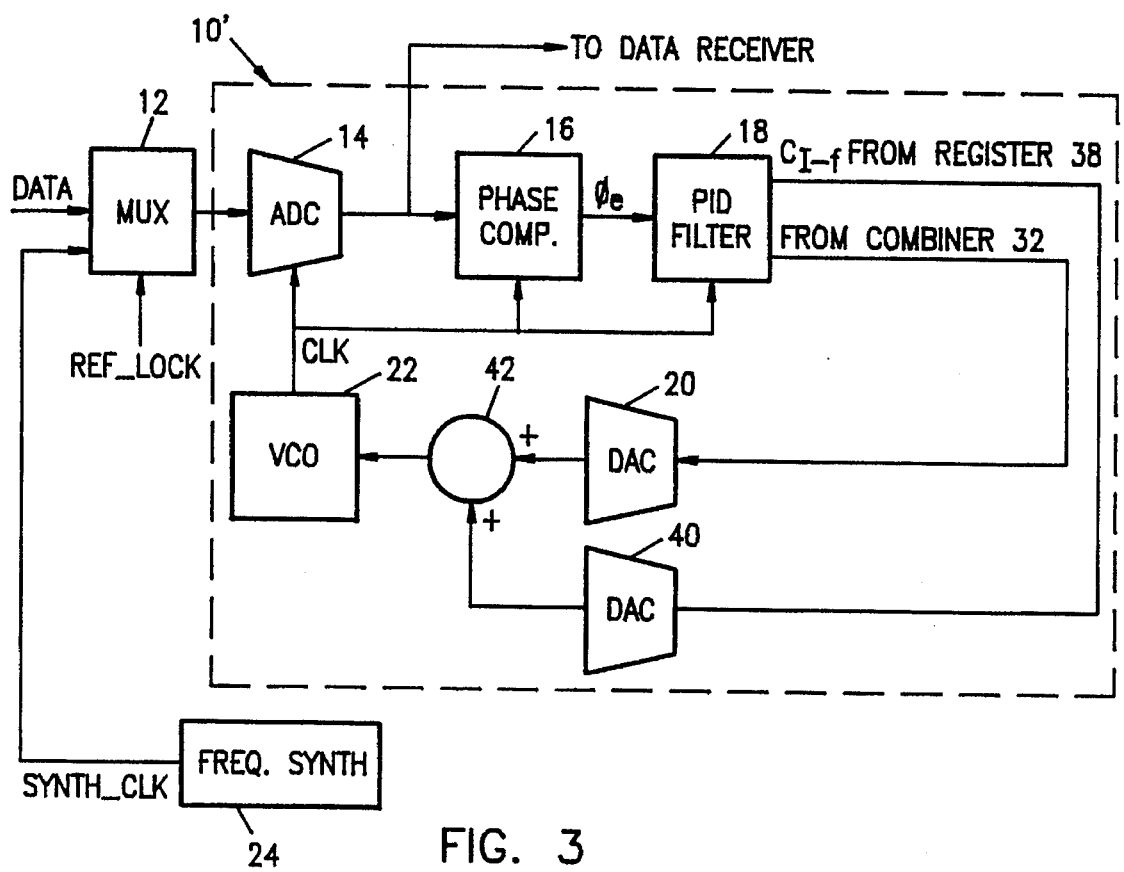
FIG. 3 is a block diagram of a PLL circuit in accordance with the present invention.

FIG. 3 is a block diagram illustrating a digital PLL 10' in accordance with the present invention. (Where the components are the same as those of FIG. 1, they are given the same reference designations. For example, the multiplexor 12 shown in FIG. 3 is identical to the multiplexor 12 shown in FIG. 1.) Like PLL 10 (FIGS. 1 and 2), in a "data receive" mode of operation, PLL 10' receives the analog input data signal, DATA, via a multiplexor 12. Analog-to-digital converter (ADC) 14 uses clock signal CLK to sample the analog input data signal and to generate digital data signal samples.

Phase comparator 16 receives the digital data signal samples generated by ADC 14 and generates a phase error signal which is representative of a phase error in the digital data signal samples.

A proportional-integral-derivative (PID) filter 18' is coupled to receive the phase error signal. PID filter 18' is shown in more detail in FIG. 4. (Where the components are the same as those of FIG. 2, they are given the same reference designations.) The integral path 26 of PID filter 18', utilizing adder element 28, accumulates successively received digital data signal samples into an integral register 30. (The accumulated value is designated in FIG. 4 as $D_I$) The accumulated value $D_I$ is provided as a first input to an adder 32. The value from the derivative path 34 of PID filter 18' is provided as a second input to adder 32; and the value from the proportional path 36 of PID filter 18' is provided as a third input to adder 32. Adder 32 adds together the values provided to its three inputs and provides the result, as a digital frequency error value, to a primary digital-to-analog converter (DAC) 20. Referring back to FIG. 3, DAC 20 converts the digital frequency error value to an analog signal.

An offset value, $C_{I\text{-}f}$, is provided from an offset register 38 to an offset DAC 40 (FIG. 3). Offset DAC 40 converts the offset value to an analog signal.

The analog signals from primary DAC 20 and offset DAC 40 are combined by a combiner 42 to generate an analog oscillator control signal. The analog oscillator control signal is provided to a voltage controlled oscillator (VCO) 22. The output of VCO 22 is the clock signal CLK which ADC 14 uses to sample the analog data signal DATA.

Figure 1:
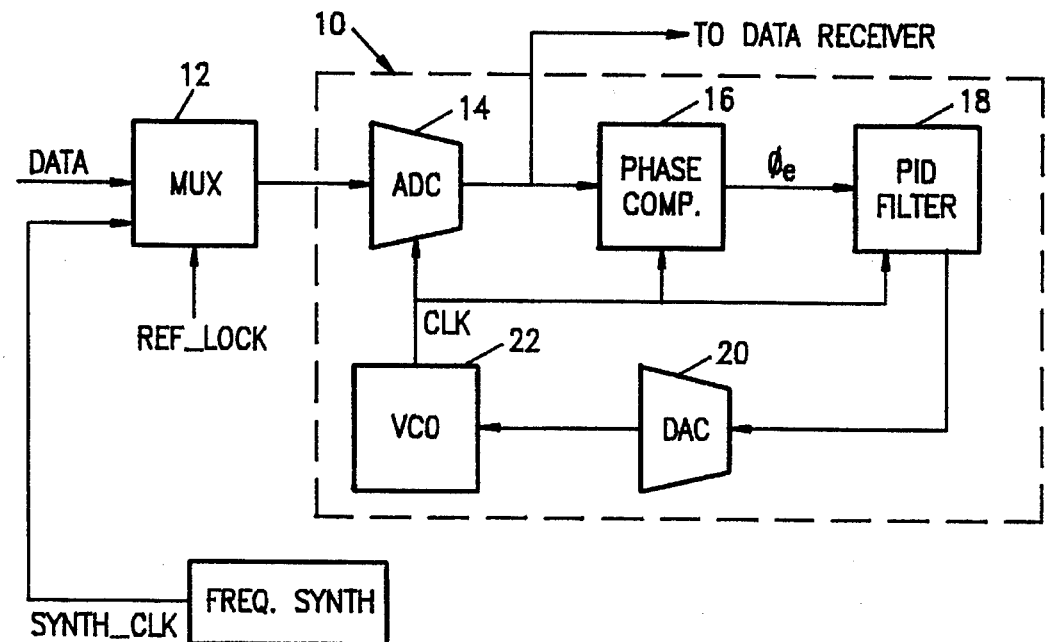
FIG. 1 is a block diagram of a conventional phase-lock loop (PLL) circuit.

Thus, the offset value may be set during a "reference lock" mode as with conventional PLL 10 shown in FIGS. 1 and 2. However, rather than copying the offset value from initial offset register 38 into integral register 30 at commencement of "data receive" mode, the offset value would instead be retained in initial offset register 38 and provided to offset DAC 40 during "data receive" mode. Thus, the value $D_I$ in integral register 30 may be initialized to zero at commencement of "data receive" mode, leaving the full range of primary DAC 20 for locking onto the analog input DATA signal.

Also, referring again to FIG. 4, an external controller (not shown) may be utilized to load offset register 38 with a value other than that which would be determined during a "reference lock" mode. Furthermore, the external controller may be utilized to read the offset value $C_{I\text{-}f}$, modify it, and write it back into offset register 38.

Figure 5:
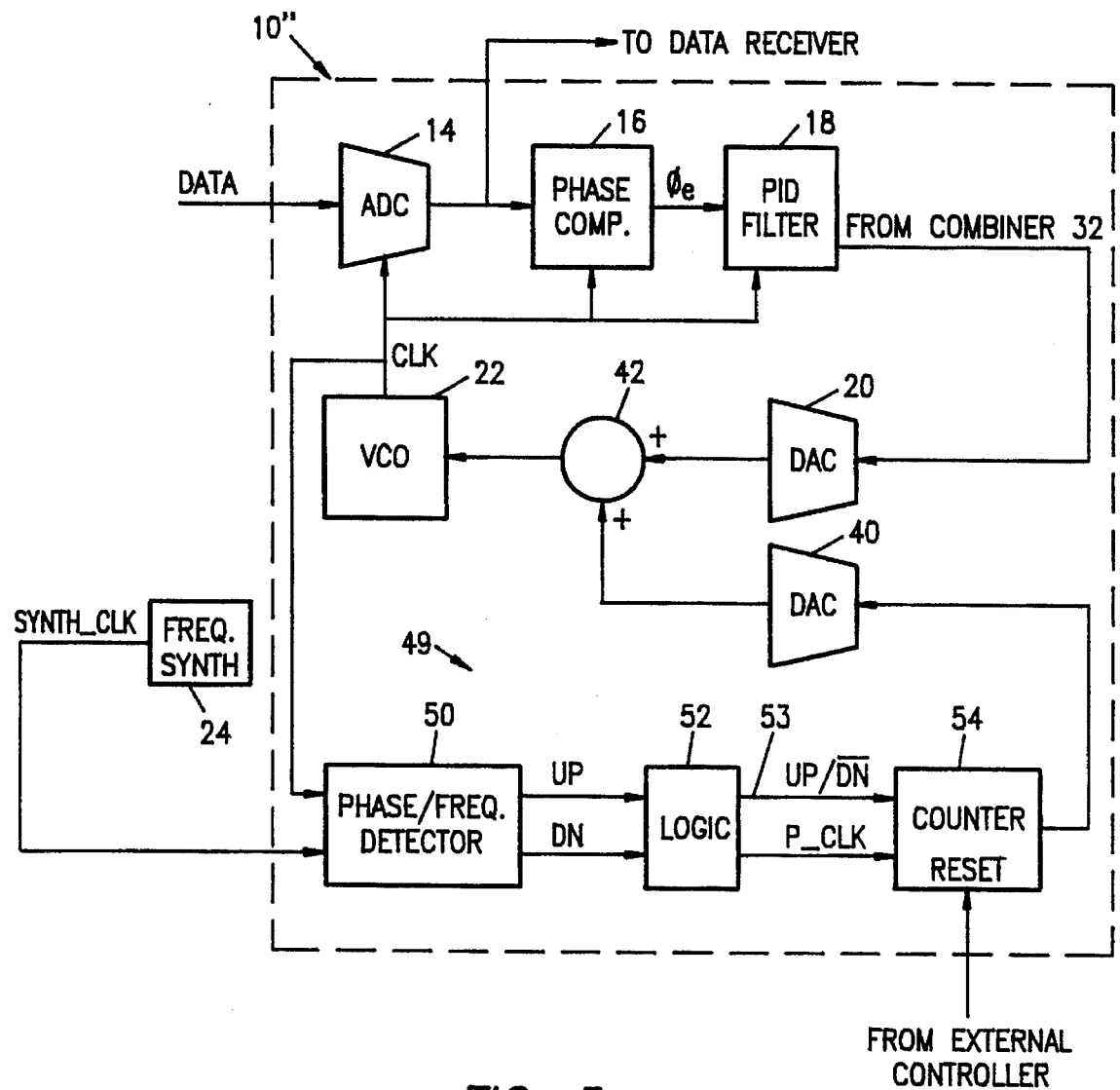
FIG. 5 is a block diagram of an alternate embodiment of a PLL circuit in accordance with the present invention.

FIG. 5 is a block diagram of an alternate embodiment of a PLL circuit 10" in accordance with the present invention. (Again, where the components are the same as those of FIG. 1, they are given the same reference designations.) With the PLL circuit 10" of FIG. 5, rather than employing a "reference lock" mode, an offset value setting portion 49 (including a phase/frequency detector 50; a logic circuit 52; and a counter 54) is utilized to set the secondary frequency offset value provided to offset DAC 40.

In particular, phase/frequency detector 50 generates either UP output pulses or DOWN output pulses, depending on whether the SYNTH_CLK output from frequency synthesizer 24 leads or lags clock signal CLK from VCO 22. Logic circuit 52 generates a phase error clock P_CLK that is synchronized to the UP (or DOWN) output pulses. In addition, logic circuit 52 provides a direction output 53, the value of which is dependent on whether phase/frequency detector 50 is generating UP output pulses (direction output 53 is UP) or DOWN output pulses (direction output 53 is $\overline{DN}$). With each rising edge of P_CLK, an offset value held in counter 54 is either incremented or decremented, depending on whether direction output 53 is UP or $\overline{DN}$. Thus, over time, counter 54 integrates the phase error in VCO 22 output CLK as compared with frequency synthesizer 24 output SYNTH_CLK.

Figure 4:
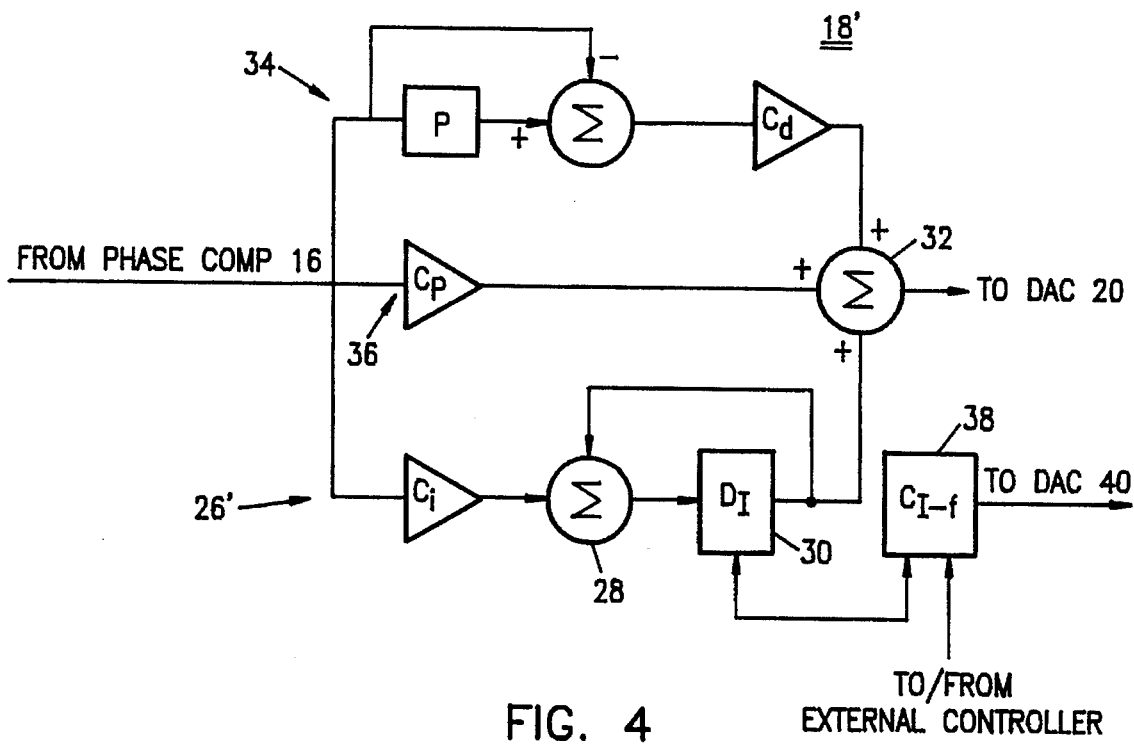
FIG. 4 is a block diagram of the PID filter of the PLL circuit of FIG. 3.

As with the FIG. 3 and 4 embodiment, offset DAC 40 of PLL 10" converts the secondary frequency offset value to an analog signal, and the analog signals from primary DAC 20 and offset DAC 40 are combined by a combiner 42 to generate an analog oscillator control signal. The offset value held in counter 54 may be reset under the control of the external controller (not shown).

While the present invention has been described in relationship to the embodiment described in the accompanying specification, other alternatives, embodiments, and modifications will be apparent to one skilled in the art. It is intended that the specification be only exemplary, and that true scope and spirit of the invention be indicated by the following claims.

What is claimed is:

1. A phase lock loop circuit, comprising:

an analog-to-digital converter (ADC) that receives analog input signals and responds to a periodic clock signal by providing corresponding digital output signals;

a phase comparator coupled to receive the ADC digital output signals and which provides a phase error signal which is representative of a phase error in the digital output signals;

a filter, the filter including an integrator path that accumulates the value of the phase error signal into a first register to generate a primary frequency error value;

a second register for holding a secondary frequency error value;

a primary digital-to-analog converter (DAC) that converts a primary filter output value, which includes the primary frequency error value, to a corresponding primary analog output signal;

a secondary DAC, coupled to receive the secondary frequency error value from the secondary register and that converts the secondary frequency error value to a corresponding secondary analog output signal;

means for combining the primary analog output signal and the secondary analog output signal to generate an oscillator control signal;

an oscillator that provides the clock signal to the ADC, wherein the frequency of the clock signal is controlled by the oscillator control signal and means for programming the secondary frequency error value to have a value equal to the primary frequency error value in the filter first register.

2. The phase lock loop circuit of claim 1, and further comprising a data selector having a first input to receive a reference analog signal and a second input to receive a data analog signal, and further having an output coupled to the ADC input, wherein the data selector responds to a data selector control signal by selectively providing one of the reference analog signal and the data analog signal at the data selector output.

3. The phase lock loop circuit of claim 1, wherein the filter further includes a proportional path and a derivative path, and wherein the primary filter output value includes an output from the proportional path and an output from the derivative path, in addition to the primary frequency error value.

4. A method for recovering data from an analog input data signal, the method comprising:

a) receiving the analog input data signal and responding to a periodic clock signal by providing corresponding digital output signals;

b) providing a phase error signal which is representative of a phase error in the digital output signals;

c) accumulating the value of the phase error signal into a filter first register to generate a primary frequency error value and providing a primary digital output signal whose value includes the primary frequency error value;

d) convening the primary digital output signal into a primary analog output value;

e) providing a secondary digital output value;

f) converting secondary digital output value into a secondary analog output value;

g) combining the primary analog output signal and the secondary analog output signal to generate an oscillator control signal; and h) providing the clock signal, controlling the frequency of the clock signal with the oscillator control signal, wherein step e) comprises initially i) performing steps a) through g) with a frequency synthesizer output signal in place of the analog input data signal; and j) providing the primary frequency error value accumulated in step c) as the secondary digital output value.

* * * * *

UNITED STATES PATENT AND TRADEMARK OFFICE
CERTIFICATE OF CORRECTION

PATENT NO. : 5,546,433
DATED : August 13, 1996
INVENTOR(S) : Toan Van Tran, et. al.

It is certified that error appears in the above-indentified patent and that said Letters Patent is hereby corrected as shown below:

In Col. 6, line 11, "convening" should be --converting--;

In Col. 6, line 14, insert between the words "converting" and "secondary" the word --the--.

Signed and Sealed this

Seventeenth Day of December, 1996

BRUCE LEHMAN

*Attest:*

*Attesting Officer*      Commissioner of Patents and Trademarks